(12) United States Patent
Sasaki

(10) Patent No.: US 6,381,872 B1
(45) Date of Patent: May 7, 2002

(54) METHOD FOR DRYING A SEMICONDUCTOR WAFER, A MIXTURE FOR DRYING, AND A DRYER

(75) Inventor: Yasushi Sasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/929,586

(22) Filed: Aug. 14, 2001

(30) Foreign Application Priority Data

Aug. 25, 2000 (JP) .......................................... 12-256325

(51) Int. Cl.$^7$ ................................................. F26B 3/00
(52) U.S. Cl. ............................. 34/449; 34/448; 34/74; 34/768; 438/905; 134/902
(58) Field of Search ......................... 34/73, 74, 218, 34/419, 448, 449, 467, 468; 134/31, 94.1, 902; 438/906, 907

(56) References Cited

U.S. PATENT DOCUMENTS

| | | | |
|---|---|---|---|
| 4,778,532 A | * | 10/1988 | McConnell .................. 134/10 |
| 4,828,751 A | * | 5/1989 | Kremer ........................ 134/19 |
| 5,022,961 A | * | 6/1991 | Izumi .......................... 438/743 |
| 5,143,103 A | * | 9/1992 | Basso .......................... 134/98.1 |
| 5,940,985 A | * | 8/1999 | Kamikawa .................... 34/471 |

FOREIGN PATENT DOCUMENTS

| | | |
|---|---|---|
| JP | 62-142328 | 6/1987 |
| JP | 8-61846 | 3/1996 |
| JP | 11-102890 | 4/1999 |

OTHER PUBLICATIONS

Motai, K. et al., "The Effect of IPA Adsorption on Thin Oxide", *Extended Abstracts of the 1997 International Conference on Solid State Devices and Materials*, Hamamatsu (1997), pp. 24–25.

* cited by examiner

Primary Examiner—Ira S. Lazarus
Assistant Examiner—Kathryn S. O'Malley
(74) Attorney, Agent, or Firm—Hutchins, Wheeler & Dittmar

(57) ABSTRACT

A mixture of lower alcohols whose mean molecular weight is 46 or less is supplied onto a surface of a semiconductor wafer cleansed with water. With this supply, the amount of alcohols left on the semiconductor wafer which has been dried can be suppressed to 2 ng/cm$^2$ or less, and thus a gate oxide film formed on the semiconductor wafer is prevented from deterioration. As a result, a high yield of semiconductor products can be realized.

8 Claims, 3 Drawing Sheets

| VOLUME RATIO (METHANOL:ETHANOL:IPA) | MEAN MOLECULAR WEIGHT OF MIXTURE |
|---|---|
| 1:0:1 | 46 |
| 1:1:1 | 46 |
| 2:1:1 | 42.5 |
| 3:1:1 | 40.1 |
| ... | ... |
| 50:1:1 | 32.8 |

FIG.1

| KINDS OF ALCOHOL (VOLUME RATIO) | IPA | METHANOL:ETHANOL:IPA (1:1:1) | METHANOL:ETHANOL:IPA (50:1:1) |
|---|---|---|---|
| MEAN MOLECULAR WEIGHT | 60 | 46 | 32.8 |
| AMOUNT OF RESIDUAL ALCOHOL(S) (ng/cm$^2$) | 2.8 | 2 | 1.3 |

FIG.3

METHOD FOR DRYING A SEMICONDUCTOR WAFER, A MIXTURE FOR DRYING, AND A DRYER

BACKGROUND OF THE INVENTION

1. Field of the Invention

The present invention relates to a method for drying a semiconductor wafer, a mixture for drying the same, and a dryer for drying the same.

2. Description of the Related Art

Lower alcohol may be used to dry a semiconductor wafer cleansed with pure water or the like.

Such lower alcohol to be used for drying is usually isopropyl alcohol (IPA), because of its high volatility, low toxicity, and cheapness.

However, as circuits formed on semiconductor wafers are more and more miniaturized, defects caused by alcohol left on the surface of those products after drying are found more frequently.

It is reported in "Extended Abstracts of the 1997 International Conference on Solid State Devices and Materials, Hamamatsu, 1997", pp24–25, that a gate oxide film may be deteriorated if IPA of more than 2 $ng/cm^2$ is left on a semiconductor wafer. As for the reason why so much of IPA is left on a dried semiconductor wafer, a possible cause may be that molecular weight of IPA is relatively heavy, as much as 60.

A technique for drying a semiconductor wafer with using alcohol is disclosed in Unexamined Japanese Patent Application KOKAI Publication No. S62-142328, Unexamined Japanese Patent Application KOKAI Publication No. H8-61846, and Unexamined Japanese Patent Application KOKAI Publication No. H11-102890.

Specifically, in Unexamined Japanese Patent Application KOKAI Publication No. S62-142328, a technique is disclosed which is for removing water from a semiconductor wafer by reducing surface tension of water with using an organic solvent having surface tension half that of water.

In Unexamined Japanese Patent Application KOKAI Publication No. H8-61846, a technique is disclosed which is for pouring IPA on a semiconductor wafer cleansed with water, and volatilizing an azeotrope of water and IPA on the semiconductor wafer with using hot nitrogen gas.

In Unexamined Japanese Patent Application KOKAI Publication No. H11-102890, a technique is disclosed which is for removing water on a surface of a semiconductor wafer with higher alcohol, and removing the higher alcohol with lower alcohol to dry the wafer.

However, a technique for suppressing the amount of alcohol left on a dried semiconductor wafer to 2 $ng/cm^2$ or less is disclosed in none of those publications.

The contents of Unexamined Japanese Patent Application KOKAI Publication No. S62-142328, Unexamined Japanese Patent Application KOKAI Publication No. H8-61846, and Unexamined Japanese Patent Application KOKAI Publication No. H11-102890 are incorporated herein by reference.

SUMMARY OF THE INVENTION

Accordingly, it is an object of the present invention to provide a method, a mixture used for drying, and a dryer for drying a semiconductor device which realizes a high yield of semiconductor products. And it is another object of the present invention to provide a drying method, a mixture and a dryer for suppressing an amount of alcohol left on a semiconductor wafer to 2 $ng/cm^2$ or less.

To achieve the above objects, the method for drying a semiconductor wafer according to the present invention, which is for drying a semiconductor wafer cleansed with water, comprises drying a semiconductor wafer by supplying alcohol whose mean molecular weight is 46 or less to a surface of the semiconductor wafer.

According to this invention, a high yield of semiconductor products can be realized.

The alcohol may be a mixture of lower alcohols.

The alcohol may be made of at least two of methanol, ethanol, and isopropyl alcohol.

The mixture used for drying according to a second aspect of the present invention, is a mixture which is to be used to dry a semiconductor wafer cleansed with water, wherein the mixture is made of two or more kinds of alcohols, and has mean molecular weight which is 46 or less.

The mixture may be made of at least two of methanol, ethanol and isopropyl alcohol.

The dryer according to a third aspect of the present invention comprises:

a room for drying a semiconductor wafer cleansed with water;

a holder which is arranged at a predetermined position in the room, and is for holding the semiconductor wafer; and a supplier for supplying a mixture for drying the semiconductor wafer to a surface of the semiconductor wafer placed in the room, wherein the supplier supplies the mixture which has hydrophilicity, volatility, and mean molecular weight which is 46 or less.

The mixture may be made of two or more kinds of lower alcohols.

The mixture may be made of at least two of methanol, ethanol, and isopropyl alcohol.

BRIEF DESCRIPTION OF THE DRAWINGS

These objects and other objects and advantages of the present invention will become more apparent upon reading of the following detailed description and the accompanying drawings in which:

FIG. 1 is a table showing mixing ratios of methanol, ethanol, and isopropyl alcohol composing a mixture used in a drying method according to an embodiment of the present invention;

FIG. 3 is a table showing average amounts of alcohol(s) left on surfaces of semiconductor wafers which were dried by a drying method to which the present invention is applied.

DETAILED DESCRIPTION OF THE PREFERRED EMBODIMENT

Figure 2:
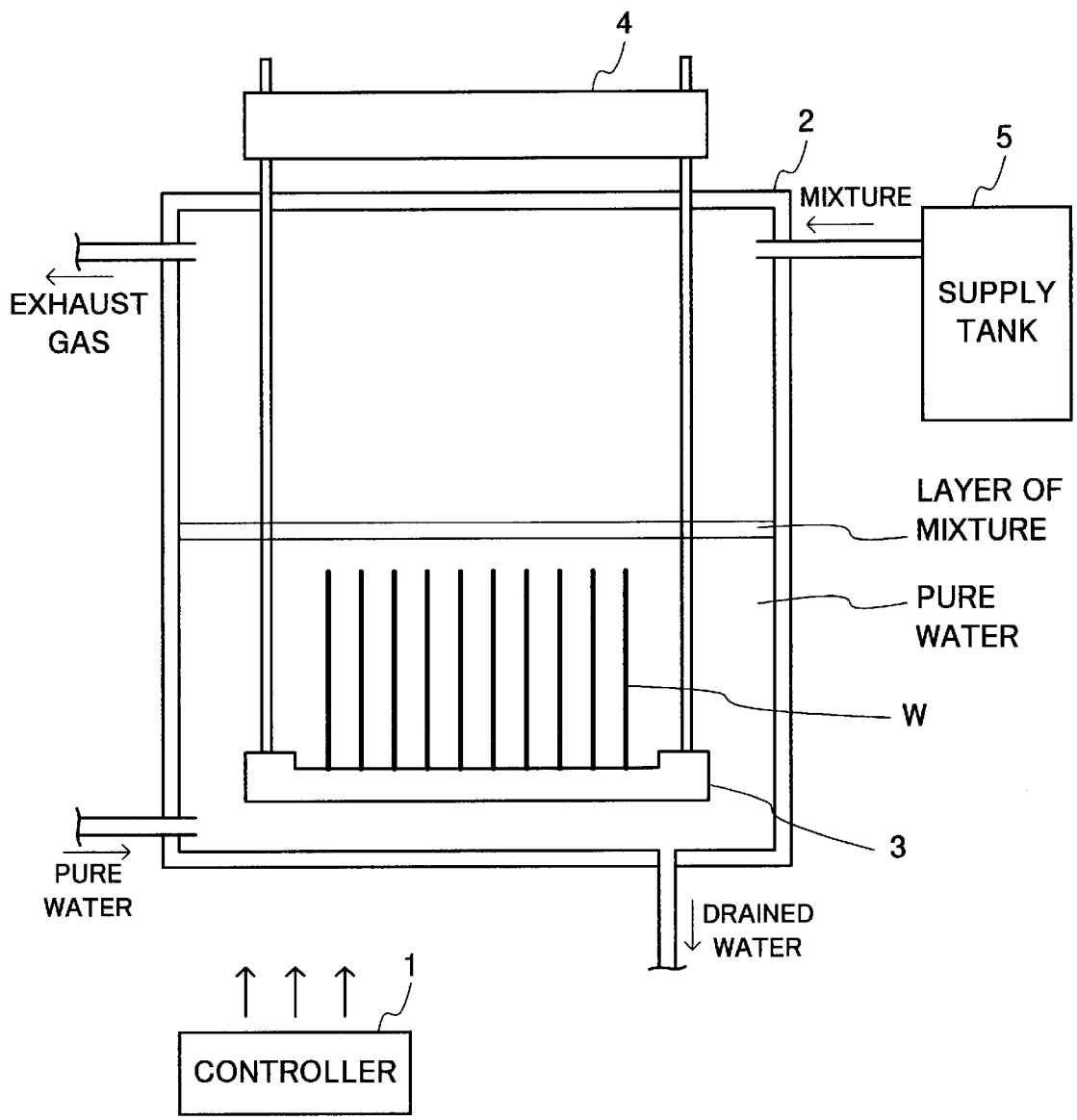
FIG. 2 is a diagram showing one example of a dryer which conducts the drying method according to the embodiment of the present invention.

The method for drying a semiconductor wafer according to one embodiment of the present invention will now be explained with reference to the accompanying drawings.

The drying method according to this embodiment of the present invention dries a semiconductor wafer cleansed with pure water with using a mixture of lower alcohols whose mean molecular weight is 46 or less. By doing so, the amount of alcohols left on the surface of the dried semiconductor wafer can be suppressed to 2 ng/cm² or less, and deterioration of a gate oxide film formed on the semiconductor wafer can be prevented.

The mixture of lower alcohols is made of two or more of, for example, methanol, ethanol, and isopropyl alcohol (IPA). To suppress the mean molecular weight of the mixture to 46 or less, methanol, ethanol, and IPA are mixed with volume ratios shown in FIG. 1.

As shown in FIG. 1, in case of a volume ratio 1:1 between methanol and IPA, the mean molecular weight of the mixture is 46. In case of a volume ratio 1:1:1 among methanol, ethanol, and IPA, the mean molecular weight of the mixture is 46. In case of a volume ratio 2:1:1 among methanol, ethanol, and IPA, the mean molecular weight of the mixture is 42.5. In case of a volume ratio 3:1:1 among methanol, ethanol, and IPA, the mean molecular weight of the mixture is 40.1. As the ratio of methanol to the others is sequentially increased, the mean molecular weight of the mixture decreases. And in case of a volume ratio 50:1:1 among methanol, ethanol, and IPA, the mean molecular weight of the mixture becomes 32.8.

The drying method according to the embodiment of the present invention will now be specifically described.

FIG. 2 is a diagram showing one example of a dryer to be used to carry out the drying method according to the embodiment of the present invention.

As shown in FIG. 2, the dryer comprises a controller 1, a process tank 2, a boat 3, a lift 4, and a supply tank 5.

The controller 1 controls the entire actions of the dryer in accordance with a previously-supplied program and data.

The process tank 2 can tightly shut thereinside. Semiconductor wafers W are cleansed and dried in the process tank 2.

The boat 3 holds a plurality of semiconductor wafers W vertically.

The lift 4 pulls up or down the boat 3 in the process tank 2 in accordance with the control by the controller 1.

The supply tank 5 stores a mixture of lower alcohols whose mean molecular weight is 46 or less. The supply tank 5 supplies gas of the mixture to the process tank 2 in accordance with the control by the controller 1.

The target semiconductor wafers W are set in the boat 3, dipped in pure water stored in the process tank 2 to be cleansed.

After cleansing in pure water, the supply tank 5 supplies the mixture gas to the process tank 2.

Part of the mixture gas supplied to the process tank 2 dissolves in the pure water, and as shown in FIG. 2, forms a layer of the mixture on the surface of the pure water.

After the mixture gas is supplied, the lift 4 pulls up the boat 3 at a predetermined speed. By this operation, the semiconductor wafers W are drawn up from the pure water. At this time, the semiconductor wafers W go through the layer of the mixture formed on the surface of the pure water.

The surface tension of the mixture is smaller than that of the pure water. When the semiconductor wafers W pass through the mixture layer, impurities such as particles or the like that have not been cleared off the semiconductor wafers W by the cleansing in the pure water are pulled off the wafers W by Marangoni effect caused by the difference between the surface tensions.

Further, the mixture of lower alcohols is hydrophilic. Therefore, when the semiconductor wafers W pass through the mixture layer, water on the surfaces of the semiconductor wafers W is replaced by the mixture of lower alcohols.

The semiconductor wafers W drawn up from the pure water are dried when the mixture of lower alcohols covering the surfaces of the wafers W volatilizes.

As described above, by carrying out the drying operation with using the mixture of lower alcohols whose mean molecular weight is 46 or less, the amount of alcohols left on the surfaces of the dried semiconductor wafers W can be suppressed to 2 ng/cm² or less.

FIG. 3 shows the results of drying operations that have been carried out.

Specifically, the drying operations were carried out upon semiconductor wafers that had undergone a step of separating elements of a logic LSI according to the design rule of 0.18 micron. Two kinds of mixtures of lower alcohols were used in the drying operations. One is a mixture that is made of methanol, ethanol, IPA with a volume ratio of 1:1:1 (mean molecular weight: 46). The other is a mixture that is made of the same materials with a volume ratio of 50:1:1 (mean molecular weight: 32.8). Further, for comparison, a drying operation was carried out with using only IPA.

As shown in FIG. 3, according to a conventional drying method with using only IPA, the average amount of alcohol left on the surfaces of dried semiconductor wafers is 2.8 ng/cm². On the other hand, in case of the mixture made of methanol, ethanol, and IPA with the volume ratio of 1:1:1, the average amount of residual alcohols is 2 ng/cm². In case of the mixture with the volume ratio of 50:1:1, the average amount of residual alcohols is 1.3 ng/cm².

As apparent from the above results, by carrying out the drying operation with using a mixture of lower alcohols whose mean molecular weight is 46 or less, the amount of alcohols left on the surface of a dried semiconductor wafer W can be suppressed to 2 ng/cm² or less. Because of such suppression, deterioration of a gate oxide film formed on the semiconductor wafer W can be prevented. As a result, a high yield of semiconductor products can be realized.

Other than this pull-up drying method explained above, methods as follows may be used. That is, a method for dipping a semiconductor wafer in liquid of a mixture of lower alcohols, or a method for spraying gas of a mixture of lower alcohols directly onto the surface of a semiconductor wafer. According to those methods, water on the surface of a semiconductor wafer is replaced by a mixture of lower alcohols.

In the above-described embodiment, three kinds of lower alcohols, that is, methanol, ethanol, and IPA are used. However, alcohols other than the above alcohols may be used as long as the mean molecular weight can be suppressed to 46 or less.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2000-256325 filed on Aug. 25, 2000, and including specification, claims, drawings and summary. The disclosure of the above Japanese Patent Application is incorporated herein by reference in its entirety.

What is claimed is:

1. A method for drying a semiconductor wafer cleansed with water, comprising drying a semiconductor wafer by supplying alcohol whose mean molecular weight is 46 or less to a surface of said semiconductor wafer.

2. The method for drying a semiconductor wafer according to claim 1, wherein said alcohol is a mixture of lower alcohols.

3. The method for drying a semiconductor wafer according to claim 2, wherein said alcohol is made of at least two of methanol, ethanol, and isopropyl alcohol.

4. A mixture which is to be used to dry a semiconductor wafer cleansed with water, wherein said mixture is made of two or more kinds of alcohols, and has mean molecular weight which is 46 or less.

5. The mixture according to claim 4, wherein said mixture is made of at least two of methanol, ethanol, and isopropyl alcohol.

6. A dryer, comprising:
   a room for drying a semiconductor wafer cleansed with water;
   a holder which is arranged at a predetermined position in said room, and is for holding said semiconductor wafer; and
   a supplier for supplying a mixture for drying said semiconductor wafer to a surface of said semiconductor wafer placed in said room,
   wherein said supplier supplies said mixture which has hydrophilicity, volatility, and mean molecular weight which is 46 or less.

7. The dryer according to claim 6, wherein said mixture is made of two or more kinds of lower alcohols.

8. The dryer according to claim 7, wherein said mixture is made of at least two of methanol, ethanol, and isopropyl alcohol.

* * * * *